United States Patent [19]

Juntenen

[11] Patent Number: 5,091,816
[45] Date of Patent: Feb. 25, 1992

[54] PROCEDURE AND DEVICE FOR OVERLOAD AND SHORT-CIRCUIT PROTECTION OF OUTPUT DRIVERS

[75] Inventor: Asko Juntenen, Hyvinkaa, Finland

[73] Assignee: Kone Elevator GmbH, Baar, Switzerland

[21] Appl. No.: 418,672

[22] Filed: Oct. 10, 1989

[51] Int. Cl.⁵ .............................................. H02H 3/06
[52] U.S. Cl. ....................................... 361/18; 361/59; 361/74; 363/50
[58] Field of Search ..................... 361/18, 56, 59, 57, 361/89-91, 111, 58, 45, 87, 74; 363/50, 55, 56

[56] References Cited

U.S. PATENT DOCUMENTS

| | | |
|---|---|---|
| 3,543,091 | 11/1970 | Marek . |
| 3,591,832 | 7/1971 | Peika . |
| 3,599,042 | 8/1971 | Andrews . |
| 4,040,116 | 8/1977 | Sheldon ............................... 361/18 |
| 4,202,023 | 5/1980 | Sears ................................... 361/18 |
| 4,203,141 | 5/1980 | Bishop et al. ....................... 361/18 |
| 4,394,703 | 7/1983 | Butcher ............................... 361/101 |
| 4,423,457 | 12/1983 | Brajder ............................... 361/86 |
| 4,544,981 | 10/1985 | Hakoopian ......................... 361/93 |
| 4,695,915 | 9/1987 | Mahalele et al. ................... 361/56 |
| 4,698,582 | 10/1987 | Braun et al. ....................... 361/86 |
| 4,788,474 | 11/1988 | Kokubu et al. .................... 315/119 |
| 4,809,122 | 2/1989 | Fitzner ............................... 363/56 X |
| 4,835,649 | 5/1989 | Salerno .............................. 361/18 |

FOREIGN PATENT DOCUMENTS

| | | |
|---|---|---|
| 0107137 | 5/1984 | European Pat. Off. . |
| 0242759 | 10/1987 | European Pat. Off. . |
| 3121754 | 9/1982 | Fed. Rep. of Germany . |
| 3409058A1 | 9/1985 | Fed. Rep. of Germany . |
| 34325670C1 | 12/1985 | Fed. Rep. of Germany . |
| WO88/01108 | 2/1988 | PCT Int'l Appl. . |
| 328034 | 9/1970 | Sweden . |
| 7802360 | 4/1982 | Sweden . |
| 2152305A | 7/1931 | United Kingdom . |
| 1123076 | 2/1966 | United Kingdom . |
| 1402386 | 8/1975 | United Kingdom . |
| 1467055 | 3/1977 | United Kingdom . |
| 1512073 | 5/1978 | United Kingdom . |
| 2145593A | 3/1986 | United Kingdom . |
| 2183955A | 6/1987 | United Kingdom . |

Primary Examiner—Todd E. DeBoer
Attorney, Agent, or Firm—Birch, Stewart, Kolasch & Birch

[57] ABSTRACT

A procedure and device for overload and short-circuit protection of output drivers, uses a circuit that functions at several control voltage levels and in which at least one output driver is controlled in a normal situation by a reference value set independently of external control, whereas in a short-circuit or overload situation the driver receives a control voltage for short instants only, and in which the reference value begins to fall rapidly when the load current of the output driver exceeds a set limit.

2 Claims, 5 Drawing Sheets

PROCEDURE AND DEVICE FOR OVERLOAD AND SHORT-CIRCUIT PROTECTION OF OUTPUT DRIVERS

BACKGROUND OF THE INVENTION

1. Field of the Invention

The present invention relates to a procedure and device for overload and short-circuit protection of output drivers.

2. Description of Related Art

The output drivers (transistors, FETs etc.) controlling the electric power supplied into a load will break down if overloaded or short-circuited. When the load is shortcircuited or when it assumes a low resistance (e.g. one of load solid state switches has breakdown), the collector current of the driver increases at inadmissible values. The voltage across the driver increases also which results in a high power dissipation and consequent destruction of the driver. In order to limit the collector current to an admissible value, in many devices for protection of output drivers, a resistor is connected in series in the load circuit. However, since the resistor is power dissipating and the drop of potential across it is important, this solution cannot be implemented in some applications. Furthermore, because the output drivers must be protected instantly when the faulted situation appears, a device capable to early detect an increase in collector current and with a quick protective response is required. A device for overload and short-circuit protection is proposed in U.S. Pat. No. 4,695,915. This device however, does not use a reference value, which means that the overload current limit cannot be set to a desired value. Besides, the current limit varies when the voltage across the load, varies due to the variations in the output transistors base current. Also, the output transistor requires a large control current, resulting in large thermal losses. For this reason it is practically impossible to integrate several output drivers in a single IC. Moreover, the device is not turned on immediately when the control signal is applied. Instead for this purpose, a separate external pulse is required.

SUMMARY OF THE INVENTION

An object of the present invention is to overcome the above-mentioned drawbacks by designing a protection system that requires no power-consuming and heat-generating resistors in series with the load. Such resistors cause thermal losses that make it impossible to integrate several protector units in the same housing. The protection of the output drivers in this invention is realized by interrupting the output current when an overload or shortcircuit condition has been detected in the load circuit. The load circuit is interrupted by immediately turning off the output driver. During the normal functioning, the external control signal drives the driver output signal. The level of the output signal is set by a stabilized voltage level which is applied to the load or not, according to the external control signal. Thus, the external control signal or the power supply variations, when in admissible limits, do not effect the output signal.

The invention has the important advantage that the output driver is completely shut off even in a momentary overload situation, which means that the generation of heat is immediately prevented. Furthermore, the device of the invention monitors the presence of an overload or short-circuit situation by means of very short pulses applied at regular intervals, and the driver is turned on again when, the load current has decreased under the value detected as overload situation. In this arrangement overheating can never occur. Thus it is possible to integrate several (e.g. 7) output drivers in an integrated circuit controlled by a microprocessor. In addition, the control circuit can be implemented either as a drain-type or a source-type circuit.

The circuit protects the output driver to any form of short-circuit or overload condition. Improved reliability and longer life result in that the drivers can not be overheated. It is also possible to produce a circuit that is pin-compatible with the currently used circuits, so that short-circuit protection can be effected by replacing the old circuit with a new one.

Accordingly, a method for overload and short-circuit protection of output drivers wherein at least one output driver is controlled by a control signal for normal functioning conditions representative of an external control signal and obtained from a reference value set independently of external control signal or by sensing pulses during the overload or short-circuit situation such that the reference value decreases rapidly when an output current of the output driver exceeds a set limit and the output driver is consequently turned off is disclosed.

Furthermore, a device for overload and short-circuit protection of at least one output driver comprising: a control logic for witching on or off the output driver; a control reference value unit, for obtaining reference value independently of an external control signal, the reference value signal controlling the output driver under normal functioning conditions, according to an external control signal; an overload and short-circuit monitoring unit, which controls an output voltage across the output driver, accordingly switching off the output driver should overload or short-circuit condition be detected; and an oscillator which generates sensing pulses for automatically restoring the normal functioning conditions when the overload or short-circuit condition has ended is disclosed.

BRIEF DESCRIPTION OF THE DRAWINGS

The invention will now be described by way of example, with reference to the attached drawings, wherein.

DESCRIPTION OF PREFERRED EMBODIMENTS

Figure 1A:
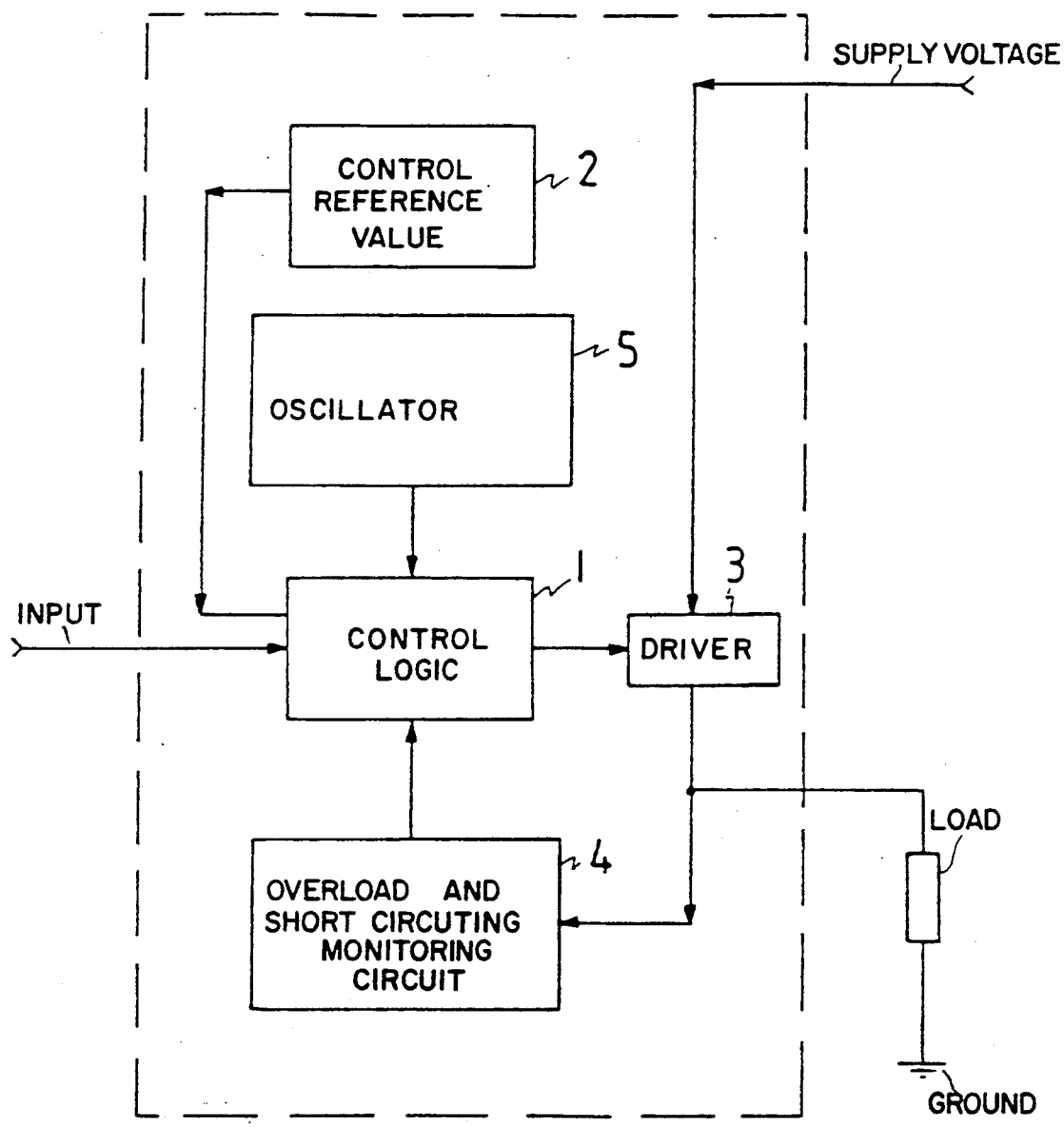
FIG. 1a is a block diagram illustrating the principle of short-circuit and overload protection in the case of a source-type control output.

Let us first consider a source-type control output driver (transistor, FET etc.) which will break down if overloaded or short-circuited. The block diagram in FIG. 1a illustrates the principle of operation of the short-circuit and overload protection circuit for such a driver. When the input signal is switched on, the control logic 1 issues a short sensing pulse to the driver 3 while at the same time monitoring the output for detecting the presence of a short-circuit or overload condition. If no short-circuit or overload condition exists, the control logic 1 applies to the driver 3 a control signal determined by the control reference value circuit 2, and the driver is thus turned on. However, if a short-circuit or overload condition is detected, the overload and short-circuit monitoring circuit 4 interrupts the control signal from the control logic 1 to the driver 3 and the input signal becomes inoperative. After the overload or short-circuit condition has disappeared, the driver is again turned on by a pulse from an oscillator 5'. The oscillator 5 monitors the duration of the short-circuit or overload condition by applying, via the control logic 1', short sensing pulses to the driver 3' at regular intervals, and as soon as the overload/short-circuit condition has been removed, the driver 3' restarts operating in accordance with the input signal.

Figure 2:
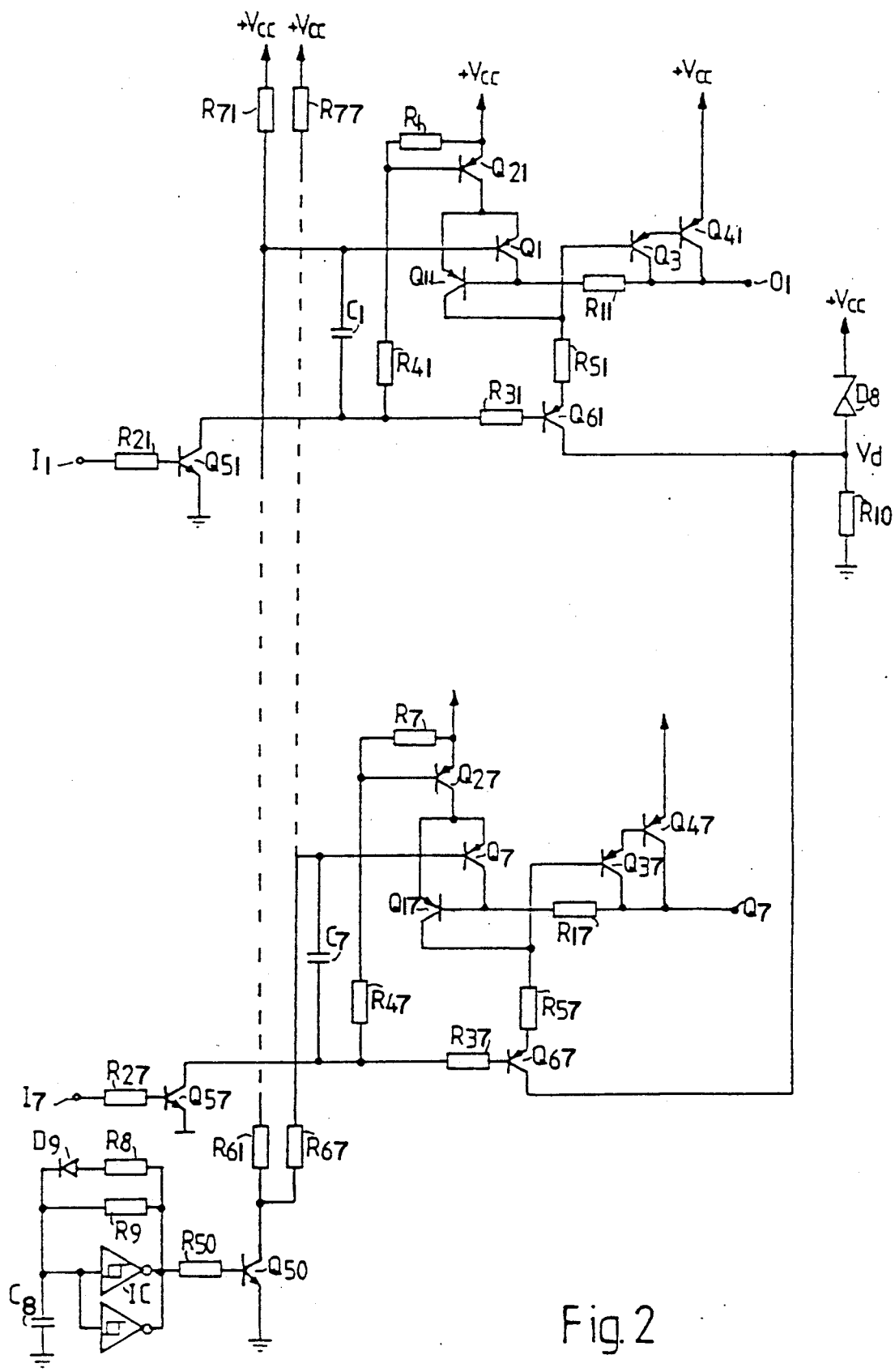
FIG. 2 shows a source-type overload and short-circuit protector.

FIG. 2 represents the source-type overload and shortcircuit protectors of output drivers for seven inputs I1...I7, and the control units for input I1 and I7. All circuits are identical in construction and operation, so only the unit for input I1 will be described here. In the FIG. 2, the last digit of each reference numeral for circuit components of input I1 is 1, a.s.o. (e.g. 7 for circuit components of input I7).

The output driver (referred 3 in FIG. 1a) consists of two transistors Q31 and Q41 connected as a Darlington pair. The emitter of the Darlington pair is connected to the supply voltage +Vcc and the collector is connected to the output 01. In the control logic for the output driver, the emitter of the first transistor Q1 is connected to the collector of an auxiliary transistor Q21, the collector of Q1 is connected to the base of a second transistor Q11, and the base of Q1 is connected to a point between resistor R61, resistor R71. The other terminal of R71 is connected to the supply voltage +Vcc, and the other terminal of R61 is connected to the collector of the oscillator transistor Q50. The emitter of the auxiliary transistor Q21 is connected to the supply voltage +Vcc. The emitter and base of Q21 are connected by resistor R1. The input signal I1, via resistor R21, is applied to the base of a third transistor Q51 via a resistor 21. The emitter of Q51 is connected to ground and its collector via is connected capacitor C1 to the base of the first transistor Q1. The collector of Q51 is also connected, via resistor R41, to the base of the auxiliary transistor Q21 and, via resistor R31, to the base of a fourth transistor Q61. The overload and short-circuit monitoring circuit (referred by 4 in FIG. 1a) consists of the second transistor Q11 and the feedback resistor R11. The emitter of the second transistor Q11 is connected to the collector of the auxiliary transistor Q21, the base of Q11 is connected via feedback resistor R11 to the output 01, and the collector of Q11 is connected to the base of the output driver and, to the emitter of the fourth transistor Q61 via resistor R51. In each unit, the collector of the fourth transistor Q61 is connected to the control reference voltage Vd, obtained at a point between a Zener diode D8 and a ninth resistor R10. The control reference voltage Vd is obtained by dividing the supply voltage Vcc on Zener diode D8, connected to Vcc, and resistor R10, connected to ground. This circuit is referred by 2 in FIG. 1a.

Figure 1B:
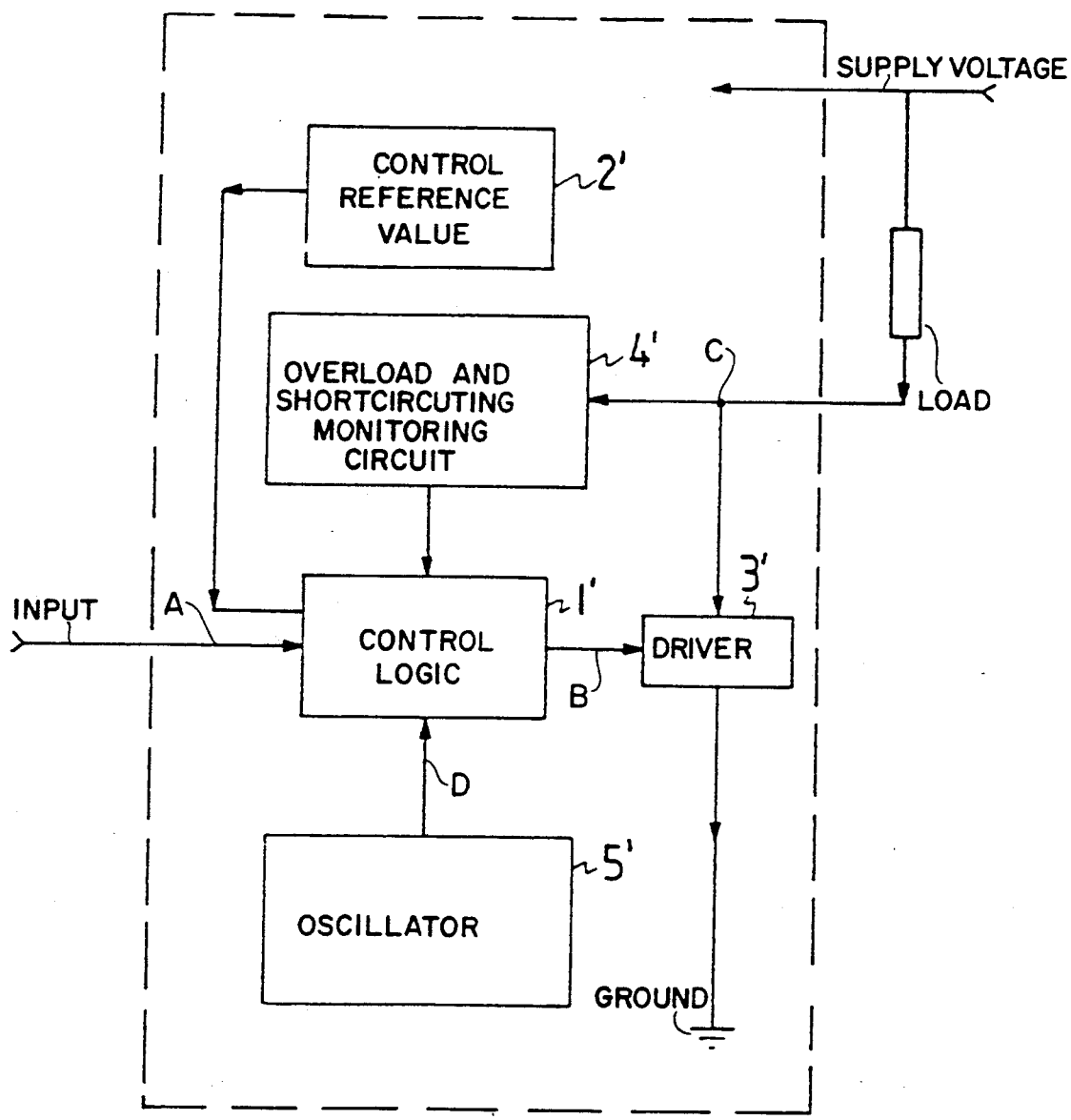
FIG. 1b is a block diagram illustrating the principle of short-circuit and overload protection in the case of a drain-type control output.

The oscillator (referred by 5 in FIG. 1) is common to all control units. It consists of a capacitor C8 and two Schmitt triggers IC. Connected across the Schmitt triggers are a resistor R9 and a series circuit including a diode D9 and a resistor R8. The output of the oscillator is connected via resistor R50 to the base of transistor Q50, whose emitter is grounded.

Under normal functioning conditions, when the voltage at the input I1 is increased, the third transistor Q51 starts to conduct, turning on the auxiliary transistor Q21. The first transistor Q1 is now turned on by a signal obtained via capacitor C1. Thus the second transistor Q11 receives a base signal that prevents it from conducting. As a result of these actions, the fourth transistor Q61 starts to conduct, thus applying a control voltage to the base of the output driver. Diode D8 constitutes a bias regulator ensuring that small variations in the supply voltage will not affect the the control reference voltage Vd and consequently control of the output stage. When the voltage of the output 01 falls, the since its base potential has decreased the second transistor Q11 begins to conduct, thus varying the base voltage of the output driver so that the latter begins to turn off. This has the effect that the output voltage 01 rapidly falls further. In this manner, the output driver is shut off very quickly. The flow of leakage current is prevented by means of the auxiliary transistor Q21, which is off resistor R1 and the resistor R41.

Should the faulted condition be ended, the normal functioning conditions are automatically reinstated by an internal signal, i.e., the pulses generated by the oscillator (referred 4 in FIG. 1a). The oscillator circuit outputs short sensing pulses at regular intervals to monitor the presence of faulted condition. The oscillator pulse turns on the first transistor Q1, thereby turning of the second transistor Q11. The output driver is now controlled by the fourth transistor Q61. If the faulted condition has ended, the output voltage at 01 has the working value and the transistor Q11 remains turned off. Thus, the output driver remains in the conducting state.

Next, let us consider a drain-type control output driver (transistor, FET etc.) which will break down if overloaded or short-circuited. In this case the overload/short-circuit protection is based on the principle illustrated by FIG. 1b. The difference with respect to the circuit of FIG. 1a is that with respect to the circuit of FIG. 1a the load is connected to the supply voltage, whereas in the case of a source-type protection circuit the load is connected to ground.

Figure 3:
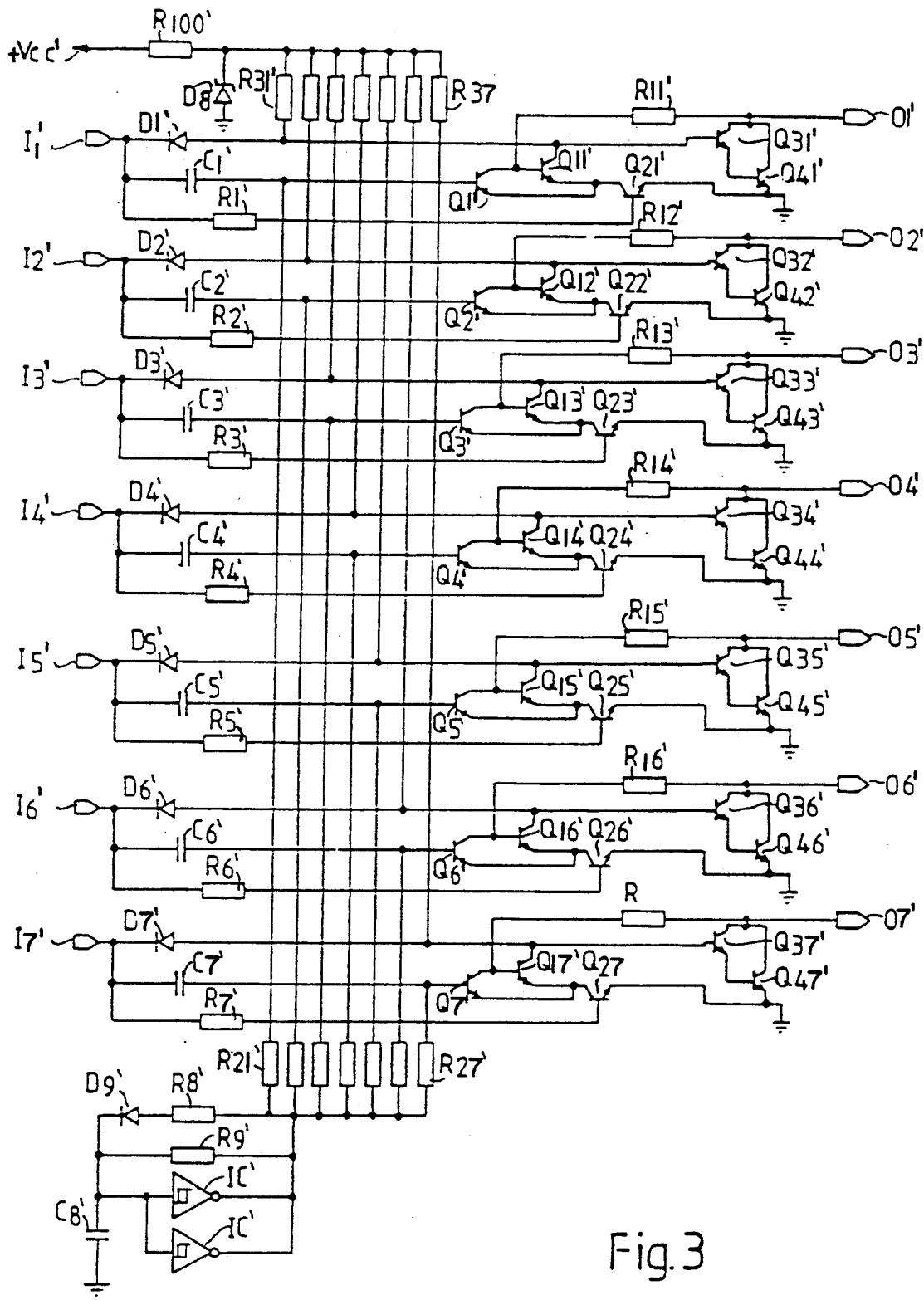
FIG. 3 shows a drain-type overload and short-circuit protector.

FIG. 3 shows the drain-type overload and short-circuit protection of output drivers for seven inputs I1'...I7'. The control units are similiar in construction and operation, and they all have similiar components. The components in each unit are marked with reference numbers in which the last digit corresponds to the number of the input in question. Will be further described the control unit of input I1' as an example.

It this circuit, the output driver consists of two transistors Q31' and Q41' connected as a Darlington pair. In the control logic for the output driver (referred 1' in FIG. 1b), the collector of the first transistor Q1' is connected to a feedback resistor R11', and to the base of a second transistor Q11'the other terminal of feedback resistor R11' is connected to the output of O: the emitter of Q1' is connected to the emitter of the second transistor Q11'the control reference value circuit (referenced by 2' in FIG. 1b). The reference voltage Vd' is obtained from a voltage divider comprising a and the base via a capacitor C1' to the input I1'. The base of the output driver and the collector of the second transistor Q11' are connected via a second resistor R31' to resistor R100', which is common to all drivers and connects to the supply voltage Vcc', and a Zener diode D8' connected to ground. Connected between the input I1' and resistor R31' is diode D1'. The base of the auxiliary transistor Q21' is connected to the input via resistor R1', the collector of Q21' is connected to the emitter of the second transistor Q11' and the emitter of Q21' is connected together with the emitter of the output driver to ground. The base of the first transistor Q1' is connected to an oscillator via resistor R21'.

The oscillator is common to all the control units and consists of two Schmitt triggers IC' connected to a capacitor C8'. Connected across the Schmitt triggers and a resistor R9' and a series circuit including a diode D9' and a resistor R8'.

Under normal functioning condition, when the input I1' is driven high, the first transistor Q1' is turned on by a voltage applied to its base via the capacitor C1', thus preventing conduction by the second transistor Q11'. The current flowing through resistor R31' is now passed to the base of the output driver. If the load connected to the collector of the output driver has the right value the output driver collector voltage falls below a certain value, so that the second transistor Q11' receives no base voltage and the output driver will continue to conduct. When the input is low, no leakage current can flow from the collector of the output driver through the feedback resistor R11' and the base of the second transistor Q11' to ground, because the auxiliary transistor Q21' is not conducting.

In case the collector of the output driver is short-circuited to the supply voltage, then, after the short pulse from capacitor C1' to the base of the first transistor, Q1 the second transistor Q11' is turned on because it receives a base voltage from the collector of the output driver. Consequently, the current flowing through the resistor R31' is passed to ground via the second transistor Q11, so that the output driver receives no control current and remains shut off.

Capacitor C1' forces the output into the state corresponding to the input independently of the pulse from the oscillator.

E.g. in a short-circuit situation the pulses supplied by the oscillator at regular intervals monitor the presence of the short-circuit condition. If the collector of the output driver is still short-circuited to the supply voltage, the control voltage (pulses) applied to its base will not effect a sufficient reduction in the collector voltage so that the output driver remains shut off.

After the faulted condition ends; the pulse first supplied by the oscillator will cause the collector voltage of the output driver to fall, so that the second transistor Q11' receives no control voltage and is therefore turned off. Thus, the current flows from resistor R31' to the base of the output driver, which therefore remains in the conducting state.

If desired, the output driver can be switched off by driving the input I1' into the low state, in which case the current from the second resistor R31' will not flow to the base of the output driver, which therefore ceases to conduct. Nor will the oscillator pulse turn on the output driver.

The Zener diode D8' maintains a constant voltage on the driver bases when the supply voltage Vcc' varies.

Figure 4:
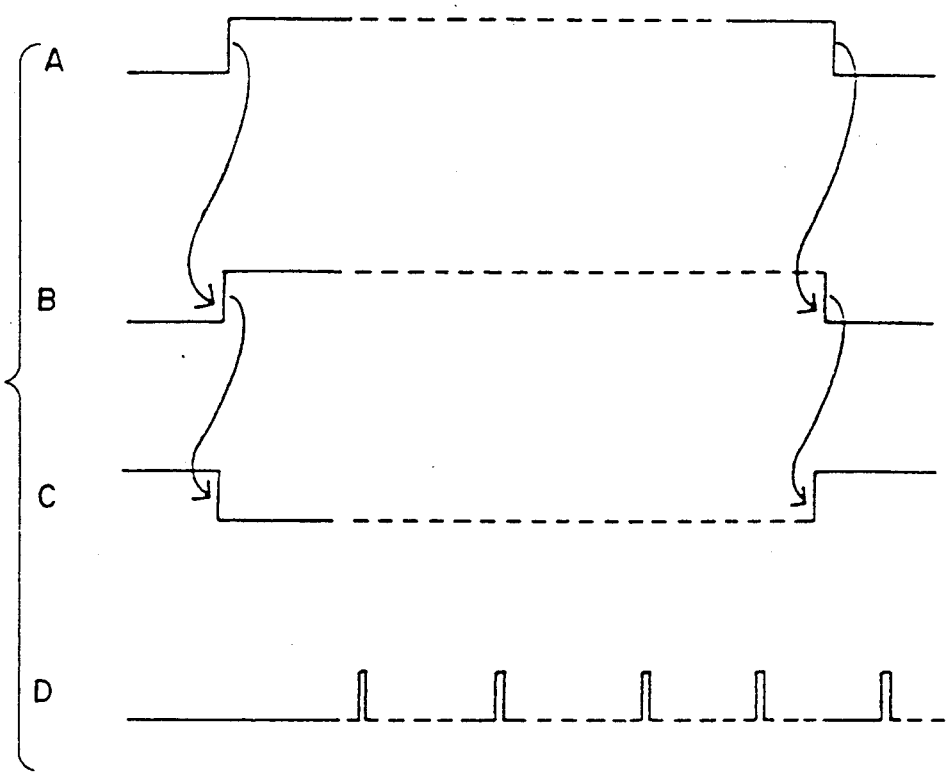
FIG. 4 represents the operational cycles of the circuit of the present invention in a normal situation and FIG. 5 represents the operational cycles of the circuit of the present invention during an overload or short-circuit condition.
Figure 5:
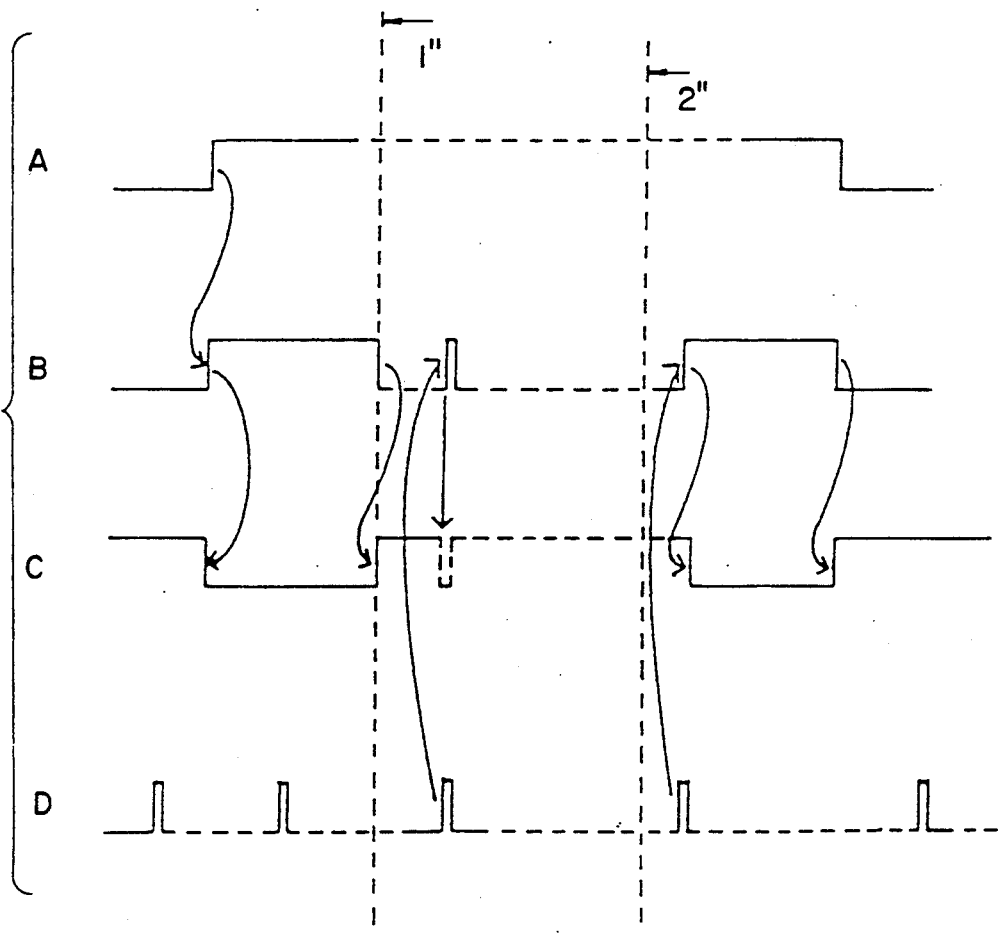

FIG. 4 represents the operational cycles in a normal situation, and FIG. 5 illustrates the operational cycles in an overload or short-circuit situation, showing the signals in the following points of the circuit (see FIG. 1b): A input, B driver input, C driver output, D oscillator. The arrows represent the sequence of events. In a normal situation, the control unit input controls the driver input, which in turn controls the driver output. In FIG. 5, a short-circuit or overload condition appears at instant 1" and ends at instant 2". During this condition, the oscillator sends a pulse which appears at the input of the driver and therefore also at driver output. After the faulted condition has disappeared, the first pulse supplied by the oscillator restores the normal operation.

It will now be obvious to a person skilled in the art that different embodiments of the invention are not restricted to the examples described above, but may instead be varied within the scope of the following claims.

I claim:

1. A device for overload and short-circuit protection of at least one output driver provided with controllable solid state switches for a drain type connection of a load, comprising:
   a) a control reference value unit, which generates a reference value, set independently of an external control signal, controlling said at least one output driver during normal functioning conditions according to said external control signal, including a stabilized voltage divider;
   b) a control logic unit, capable of switching on or off said at least one output driver, which generates a sensing pulse to detect whether an overload or short-circuit condition is present, and controls the operation of said at least one output driver either with a control signal for normal functioning conditions, or with said sensing pulse during overload or short-circuit condition, said control logic unit including a first solid state switch which is turned on during normal functioning conditions when said external control signal goes high and turns off a second solid state switch; and a third and a fourth solid state switch which are turned on or off according to said external control signal, allowing said at least one output driver to be controlled by said control signal;
   c) an overload and short-circuit monitoring unit which controls the output current of said at least one output driver, accordingly switching off said output driver should an overload or short-circuit condition be detected, including said second solid state switch and a feedback resistor connected to the load circuit for detecting the overload or short-circuit condition whereby said second switch is turned on, thus diverting said reference value signal on an alternative path; and
   d) an oscillator, coupled to said at least one output driver which generates a sensing pulse capable of automatically restoring the normal functioning conditions when the overload or short-circuit condition ends, which during an overload or short-circuit condition attempts to switch on said at least one output driver and when the overload or short circuit condition ends, turns on said at least one output driver and restores the normal functioning conditions allowing said at least one output driver to be controlled by said external control signal.

2. A device for overload and short-circuit protection of at least one output driver provided with controllable solid state switches for a source type connection, comprising:
   a) a control reference value unit which generates a reference value, set independently of an external control signal, controlling each of said at least one output driver during normal functioning conditions according to said external control signal, including a stabilized voltage divider;
   b) a control logic unit, capable of switching on or off said at least one output driver, which generates a sensing pulse to detect whether an overload or short-circuit condition is present, and controls the operation of said at least one output driver either with a control signal for normal functioning conditions, or with said sensing pulse during an overload or short-circuit condition, said control logic unit including a first solid state switch which during normal functioning conditions is turned on when said external control signal goes high and turns off a second solid state switch, allowing said at least one output driver to be controlled by said external control signal;
   c) an overload and short-circuit monitoring unit which controls the output current of said at least one output driver, accordingly switching off said at least one output driver should an overload or short-circuit condition be detected including said second solid state switch and a feedback resistor connected to the load circuit, whereby said second switch is turned on, thus diverting said reference value signal on an alternative path; and
   d) an oscillator, coupled to said at least one output driver which generates a sensing pulse capable of automatically restoring the normal functioning conditions when the overload or short-circuit condition ends, which during an overload or short-circuit condition attempts to switch on said at least one output driver and when the overload or short circuit condition ends, turns on output driver and restores the normal functioning conditions allowing said at least one output driver to be controlled by said external control signal.

* * * * *